(12) United States Patent
Hiller et al.

(10) Patent No.: US 7,880,226 B2
(45) Date of Patent: Feb. 1, 2011

(54) INTEGRATED CIRCUIT DEVICE WITH A SEMICONDUCTOR BODY AND METHOD FOR THE PRODUCTION OF AN INTEGRATED CIRCUIT DEVICE

(75) Inventors: Uli Hiller, Bad Abbach (DE); Oliver Blank, Freising (DE); Ralf Siemieniec, Villach (AT); Maximilian Roesch, Villach (AT)

(73) Assignee: Infineon Technologies Austria AG, Villach (AT)

( * ) Notice: Subject to any disclaimer, the term of this patent is extended or adjusted under 35 U.S.C. 154(b) by 7 days.

(21) Appl. No.: 12/020,077

(22) Filed: Jan. 25, 2008

(65) Prior Publication Data
US 2009/0152624 A1 Jun. 18, 2009

(30) Foreign Application Priority Data
Dec. 17, 2007 (DE) .................. 10 2007 061 191

(51) Int. Cl.
*H01L 29/72* (2006.01)
(52) U.S. Cl. .............. 257/330; 257/394; 257/397; 257/399; 257/401; 257/466
(58) Field of Classification Search ............. 257/330, 257/394, 397, 399, 401, 466
See application file for complete search history.

(56) References Cited

U.S. PATENT DOCUMENTS

| 5,126,807 | A | | 6/1992 | Baba et al. |
|---|---|---|---|---|
| 5,164,325 | A | | 11/1992 | Cogan et al. |
| 5,614,751 | A | * | 3/1997 | Yilmaz et al. ............. 257/394 |
| 6,753,228 | B2 | | 6/2004 | Azam et al. |
| 7,005,347 | B1 | * | 2/2006 | Bhalla et al. ............. 438/259 |
| 2003/0042556 | A1 | * | 3/2003 | Gajda et al. ............. 257/401 |
| 2004/0070028 | A1 | | 4/2004 | Azam et al. |
| 2005/0215010 | A1 | | 9/2005 | Henninger et al. |

FOREIGN PATENT DOCUMENTS

| DE | 10007415 | | 9/2001 |
|---|---|---|---|
| DE | 102004005774 | | 8/2005 |
| DE | 102005041322 | A1 | 3/2007 |
| DE | 102006036347 | A1 | 4/2008 |
| WO | 2007105384 | A1 | 9/2007 |

* cited by examiner

*Primary Examiner*—Edward Wojciechowicz
(74) *Attorney, Agent, or Firm*—Dicke, Billig & Czaja, PLLC

(57) ABSTRACT

An integrated circuit device with a semiconductor body and a method for the production of a semiconductor device a provided. The semiconductor body comprises a cell field with a drift zone of a first conduction type. In addition, the semiconductor device comprises an edge region surrounding the cell field. Field plates with a trench gate structure are arranged in the cell field, and an edge trench surrounding the cell field is provided in the edge region. The front side of the semiconductor body is in the edge region provided with an edge zone of a conduction type complementing the first conduction type with doping materials of body zones of the cell field. The edge zone of the complementary conduction type extends both within and outside the edge trench.

9 Claims, 14 Drawing Sheets

INTEGRATED CIRCUIT DEVICE WITH A SEMICONDUCTOR BODY AND METHOD FOR THE PRODUCTION OF AN INTEGRATED CIRCUIT DEVICE

CROSS-REFERENCE TO RELATED APPLICATIONS

This Utility patent application claims the benefit of the filing date of German Application No. DE 10 2007 061 191.0, filed Dec. 17, 2007, which is herein incorporated by reference.

BACKGROUND

The application relates to an integrated circuit device with a semiconductor body and to a method for the production of an integrated circuit device. The semiconductor body includes a cell field with a drift zone of a first conduction type. In addition, the semiconductor device includes an edge region surrounding the cell field. Field plates with a trench gate structure are arranged in the cell field.

In semiconductor devices with field plate compensation structures, the cell field is surrounded by an edge region for which an edge termination has to be provided. For this purpose, the active region, which is initially completely free of a field oxide, is defined as a cell field. In the cell field, the field plates in the trench structure are surrounded by a field plate insulation. The outer trenches or field plates of the cell field are provided with a field plate insulation which is brought out to a field oxide on the front side of the semiconductor body in the edge region.

In addition, a continuous trench, a edge trench, surrounds the entire cell field, its clearance generally corresponding to the spacing of the trench structures in the cell region.

Such a structure of a semiconductor device is subject to two types of problems. First, the edge trench is subjected to the highest loading, as compensation is no longer complete on the side of the edge trench remote from the cell field. As a result, a breakdown may occur at the continuous edge trench, the location of the breakdown being the curvature at the trench base adjacent to the cell field. There is therefore a risk that this edge breakdown may occur earlier than the cell field breakdown, so that the blocking capability of the edge trench has to be increased. A further problem is found in the region of the source fingers with conductive contact material, as these contacts are only provided outside the active cell field, leaving a certain minimum distance between the end of the body zones and the continuous edge trench.

In the region of the edge trench, the potential can directly reach the field oxide from below in the semiconductor body, which could cause problems. In principle, doping must not exceed a critical value, otherwise a potential breakdown at the trench base could jump upwards to a trench contact, whereby breakdown voltage is significantly reduced. A reduction of the concentration of doping material towards the surface, which is possible in an epitaxial process, slightly reduces the ability of the potential to reach the field oxide while reducing the load on the continuous edge trench. The reduction of the concentration of doping material, however, adversely affects on resistance.

For these and other reasons, there is a need for the present invention.

SUMMARY

An integrated circuit device with a semiconductor body and a method for the production of an integrated circuit device is provided. The semiconductor body includes a cell field with a drift zone of a first conduction type. In addition, the semiconductor device includes an edge region surrounding the cell field. Field plates with a trench gate structure are arranged in the cell field, while an edge trench surrounding the cell field is provided in the edge region. In the edge region, the front side of the semiconductor body includes an edge zone of a conduction type complementing the first conduction type and identical to the conduction type of the body zones of the cell field. The edge zone of the complementary conduction type extends both within and outside the edge trench.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates a diagrammatic cross-section through a section of a semiconductor body after the introduction of trench structures.

FIG. 6 illustrates a diagrammatic cross-section through the section from FIG. 5 after the application of an insulating layer.

FIG. 7 illustrates a diagrammatic cross-section through the section from FIG. 6 after the trench structure has been filled with a conductive material.

FIG. 8 illustrates a diagrammatic cross-section through the section from FIG. 7 after the removal of the conductive material from a field oxide on front sides of mesa structures.

FIG. 9 illustrates a diagrammatic cross-section through the section from FIG. 8 after the application of a covering to the field oxide in the edge region.

FIG. 10 illustrates a diagrammatic cross-section through the section from FIG. 9 after the removal of the field oxide above the cell field and the etching in the trench.

FIG. 11 illustrates a diagrammatic cross-section through the section from FIG. 10 after the upper region of the trench structure has been filled with a conductive material, and FIG. 12 illustrates a diagrammatic cross-section through the section from FIG. 11 after the ion implantation of body zones.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
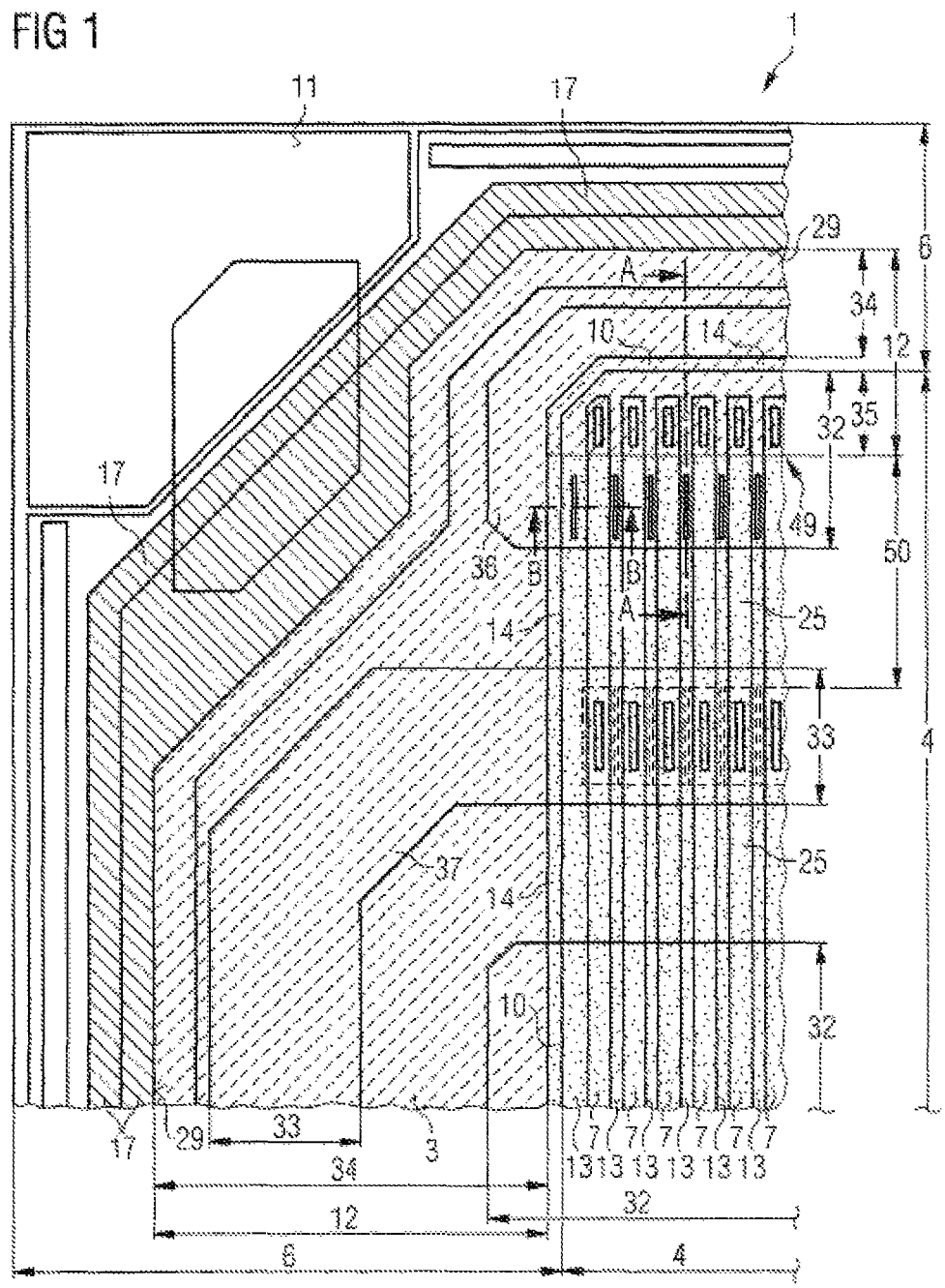
FIG. 1 illustrates a diagrammatic top view of a section of an integrated circuit semiconductor device according to an embodiment.

FIG. 1 illustrates a diagrammatic top view of the layout of a section of an integrated circuit semiconductor device 1 according to an embodiment. A strip-shaped trench structure 25 is formed in a cell field 4. This cell field 4 is surrounded by an edge trench 10 with a field plate 14. In this embodiment, an edge zone 12 extends both in the interior as an inner edge zone 35 and on the outside as an outer edge zone 34 and is characterized by a doping material of a complementary conduction type near the surface of the semiconductor body 3, which is identical to that of the body zones of the semiconductor device 1. This edge zone 12 is indicated in FIG. 1 by a hatching of broken lines and is, outside the edge trench 10, surrounded by a channel stopper region 17 indicated by a hatching of continuous lines bounded by the edge of the semiconductor chip.

This results not only in an outer edge zone 34 extending from the edge trench 10 to the annular channel stopper 17, but also in an inner edge zone 35 extending from the edge trench 10 to the outer body zones 49 of the cell field 4.

The effect of such an inner edge zone 35, which extends from the edge trench 10 along line A-A from FIG. 1 parallel to the cell field trenches 25 to the outer body zones 49, is illustrated by a modified or improved potential profile which can be verified by simulation. The transition from the active region of the cell field 4, this being the part of the cell field 4 where there are p-type body zones 13, is addressed. At the same time, up to the edge termination of the MOS transistor with compensation by field plates in trenches as illustrated by way of example in FIG. 1, there is no field oxide in this cell field 4.

Figure 4:
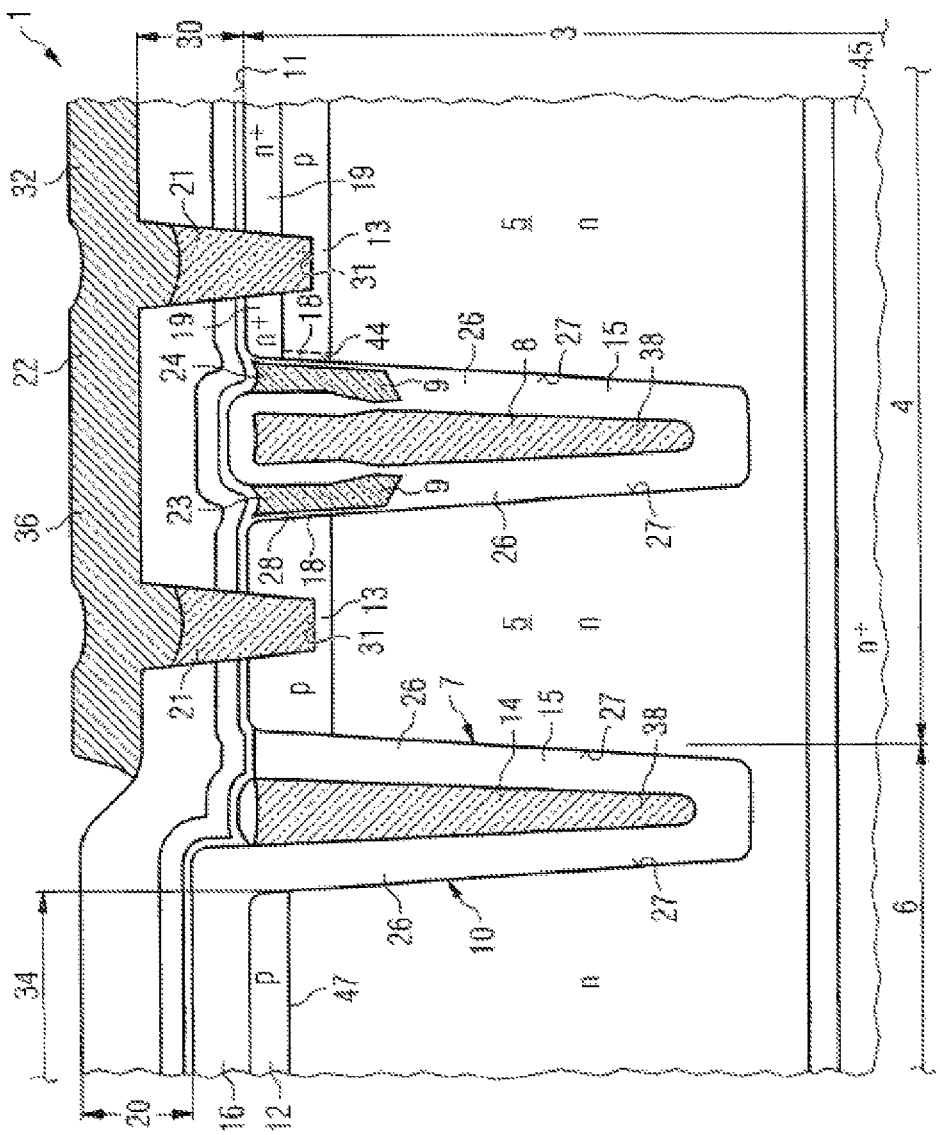
FIG. 4 illustrates a diagrammatic cross-section through the section of the semiconductor device according to FIG. 1 along line B-B.

The channel stopper 17 is at drain potential and is represented by a polysilicon field plate in this embodiment. This field plate also marks the body implantation in this region and therefore provides the necessary break in the outer edge zone 34. A metal may be used in place of polysilicon. Adjacent to the strip-shaped trench structure 25 in the cell field 4 and the flatness of the inner and outer edge zones 35 and 34 respectively, FIG. 1 illustrates metallization surfaces for a metallization layer 32 for a source connection electrode 36, which in this top view covers two fields of the surface of the semiconductor device 1, and a simultaneously applied metallization layer 33 for a gate connection electrode 37, which in the active cell field 4 connects the electrodes 9 made of an electrically conductive material, which are illustrated in FIG. 4, to one another.

Figure 2:
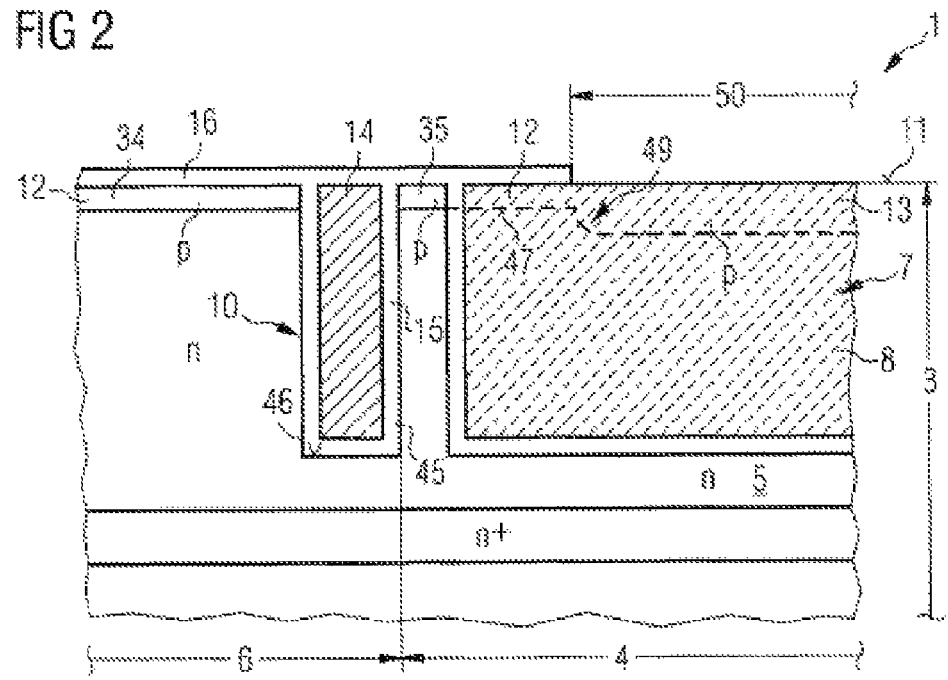
FIG. 2 illustrates a schematic representation of a cross-section through the section of the semiconductor device 1 along line A-A through a field plate or trench structure.

FIG. 2 illustrates a schematic representation of a cross-section through the section of the semiconductor device 1 along line A-A through a field plate 8 or trench structure 7. The line A-A initially runs from the outer edge zone 34 in the edge region 6 through the edge trench 10 and then parallel to the elongated field plates 8 of the cell field 4 to the body zones 13 in the body zone region 50. The section illustrated in cross-section in FIG. 2 is the transitional region from a cell field 4 to an edge region 6. The edge region 6 includes an edge zone 12, the edge zone 12 being divided into an outer edge zone 34 and an inner edge zone 35 by the edge trench 10 surrounding the cell field 4.

In the edge region 6, a breakdown voltage which is at least equal to that in the cell field 4 has to be achieved.

To avoid a premature breakdown, an inner edge zone 35 of this embodiment, which extends within the cell field 4 from the edge trench 10 to outer body zones 49, is doped with a material of the same conduction type as the body zones 13 of the cell field 4 and therefore has a complementary conduction type and a p-n junction 47 to the n-type material of the drift zone 5 located below. For this purpose, the doping materials have, during the production of the body zones 13, been implanted through a thinned field oxide 16 up to mesa structures of the cell field 4 of the semiconductor device 1 with its strip-shaped trench structures 7. As a result, the impurity concentration is lower in the inner edge zone 35 and the outer edge zone 34 than in the body zones 13. In addition, penetration depth is correspondingly reduced, as the body zones 13 are implanted while the front side 11 of the semiconductor body 3 is completely free of oxide in the cell region 4. Nevertheless, as a result the potential in the inner edge zone 35 is restricted to the semiconductor body 3 and does not reach the field oxide 16. This is illustrated in FIG. 3 by using the plotted profile of the space charge zone in the off state.

It further has to be ensured that the outer edge zone 34 does not extend to the outer-most edge of the semiconductor chip. In this embodiment, this can be achieved by using the structure of a channel stopper as described above, which at the same time serves as a masking structure for the ion implantation of the doping materials of the complementary conduction type, which are used both for the base zones 13 in the cell field 4 and for the edge zone 12 in the edge region 6 as well as partially in the cell field 4.

Figure 3:
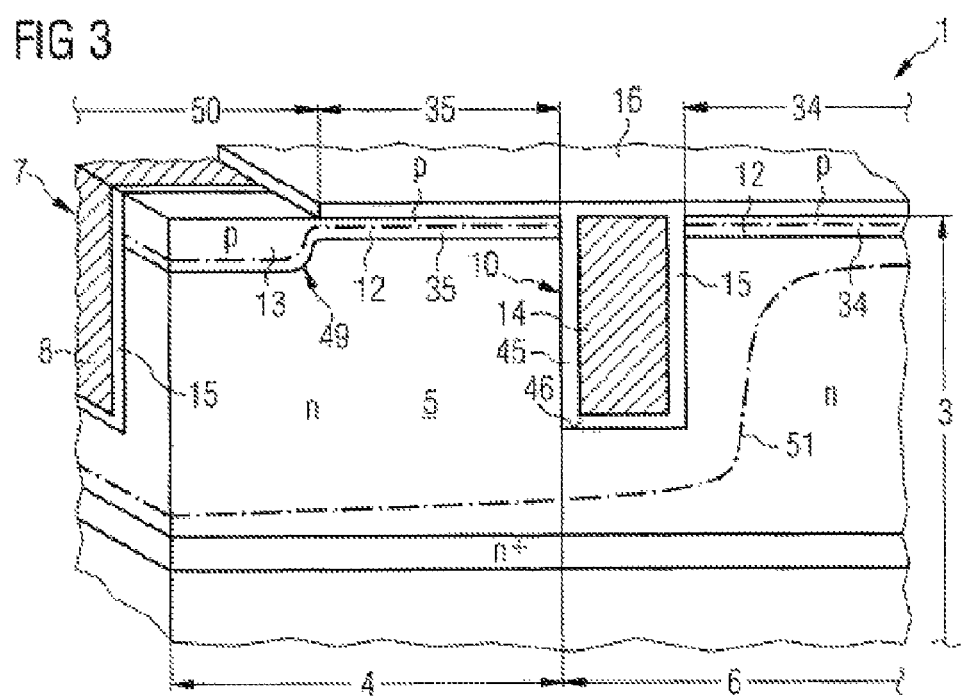
FIG. 3 illustrates a perspective schematic representation of the section of the semiconductor device according to FIG. 1 along line A-A through a body zone or mesa structure.

In the embodiment according to FIGS. 1, 2 and 3, the body zone implantation is designed such that it just extends through the oxide 16 in the edge zone 12. The thickness of the oxide on the front side 11 of the edge zone 12 is expediently reduced by various process processes in the course of the production of the semiconductor body 3, so that the oxide has a significantly reduced thickness at the time of the body zone implantation, which is now used to reach the edge zone 12 with complementary doping using doping materials of the ion implantation for the body zone 13.

While a proposed thickness of the oxide layer is provided in the trench structure for the required blocking capability, the thickness of the oxide on the front side is less at the time of the body zone implantation. At a preset implantation energy, the body zone 13 can now be produced within the active cell field 4, while at the same time, as illustrated in FIGS. 2 and 3, a region of a complementary conduction type of the inner and outer edge zones 35 and 34, respectively, is formed in the edge zone 12 on the front side 11. By suitably adjusting the thickness of the field oxide on the front side, a through-implantation of part of the p-doping is made possible, so that a p-doping is obtained in the critical region and a premature breakdown is prevented at this point.

FIG. 3 illustrates a perspective schematic representation of the section of the semiconductor device 1 according to FIG. 1 along line A-A through a body zone 3 or a mesa structure, wherein the section illustrated in FIG. 2 is viewed from the other side.

Comparative simulations with semiconductor structures without complementary doping in the inner edge zone 35 show with regard to potential distribution that the potential reaches upwards in the region between the continuous edge trench 10 and the field plate 8 of the cell field 4 in a conventional structure, while the inner edge zone 35 with its complementary doping efficiently pushes the potential, which follows the form of the space charge zone indicated by a dot-dash line 51, downwards.

The potential is therefore not deflected towards the front side between the last trench structure 7 of the cell field 4 and the edge trench 10, but is pushed downwards into the semiconductor body 3, and it does not reach the field oxide 16 even in the edge region 6 after the edge trench 10, but is likewise displaced into the semiconductor body 3 by the p-n junction between the edge zone 12 with its complementary doping and the drift zone-doped semiconductor material located below, as described above. This potential profile insures that avalanche generation is reduced in a breakdown situation and remains restricted to the lower trench region 45 up to the active cell region without jumping to the front side 11 of the semiconductor body 3. As a result, an improvement is achieved in a breakdown situation owing to reduced avalanche generation, in particular owing to the fact that the curvature of the p-n junction at the body end 49 is unloaded and the major part of the avalanche generation is found at the trench base 46 in an embodiment with an existing p-type region.

The semiconductor devices structured according to FIGS. 1 to 3 are characterized by a noticeably improved potential profile, and avalanche generation can be reduced even in a breakdown situation, because the curvature of the p-n junction at the body zone end 49 is unloaded and the major part of avalanche generation is found at the trench base 46 of the edge trench 10 in an embodiment with an existing inner edge zone 35 of a complementary conduction type.

Simulations show a significant improvement of the potential profile and an increased electric strength in the region of the edge trench 10. This further improves the performance of the semiconductor device, which finds expression in a significant reduction of stationary losses in the on state.

In place of an implantation of impurities for the inner edge zone 35 synchronous with the implantation of the body zones 13, a separate ion implantation can be provided for the inner edge zone 35, in particular if the orientation and characteristics of the body zones 13 are not to be changed in a predetermined cell structure in the cell field 4. In a second ion implantation of this type, the energy used is chosen such that the thick oxide in the region of the inner edge zone 35, which has been applied, is penetrated. The dose may however be significantly less than the dose for the body zones 13 and only has to cause a re-doping of the n-type region in the inner edge zone 35 near the front side 11 of the semiconductor body 3. This separate, additional implantation for the production of an inner edge zone 35 of a complementary conduction type may be carried out immediately following the body zone implantation, or else following the driving-in using a diffusion process of the body zones 13.

In such an additional implantation process, an interruption of the generated p-type region of the outer edge zone 34 up to the edge of the semiconductor chip has likewise to be insured as described above, and the complementary doping of the edge zone 12 has to be sufficient in order not to be depleted by the drain potential. The inventive principle of an edge zone 12 of a complementary conduction type below the field oxide 16 can be applied both to n-channel MOSFETs and to p-channel MOSFETs.

In the embodiment according to FIG. 3, the body zone implantation is designed such that is just extends through the oxide 16 in the edge region 6. At the time of the body zone implantation, the thinning of the oxide 16 on the front side 11 during the preceding process steps is sufficient for a penetration of the oxide 16 using the doping materials of the body zones 13. However, as the thickness of the oxide 16 in each field plate trench determines the blocking capability of the transistor, the body zone implantation is individually adapted to suit the different blocking classes, in order to ensure the formation of an edge zone 12, in particular the inner edge zone 35, of a complementary conduction type.

FIG. 4 illustrates a diagrammatic cross-section through the section of the semiconductor device 1 according to FIG. 1 along line B-B. The section illustrated in cross-section in FIG. 4 is a transitional region from the cell field 4 to the edge region 6. Of the cell field 4, a last field plate 8 and two trench gate structures 9 surrounding the field plate 8 are illustrated. The trench structure 7 of the cell field 4 is therefore provided with a field plate 8, which may for example be surrounded by two gate electrodes 23 and 24 adjacent to the field plate 8.

As FIG. 4 illustrates, the trench structure 7 is, in the cell field 4 on the trench walls 27, provided with an oxide layer 26 for insulation in the lower region 45 of the trench structure 7 and thus of the field plate 8. In the cell field 4 and in the edge trench 10, the field plate 8 is made of a conductive material 38. In the upper region 28 of the trench structure 7 in the cell field 4, a gate oxide 18 insulates the trench gate electrodes 23 and 24 from a base zone 13 located in the upper region of the semiconductor body 3. The conduction type of this base zone 13 complements that of the drift zone 5 located below.

Finally, there are source zones 19 located near the front side 11 of the semiconductor body 3 in the cell field 4; these have the same conduction type as the drift zones 5, but are doped more highly. When a suitable potential is applied to the trench gate electrodes 23 and 24, a channel 44 forms in the body zone 5 to create a connection between the source zone 19 and the drift zone 5, enabling a current to flow from the source metallization layer 32 through a via 21 from a contact hole 31 to a drain zone 50, the cell region 4 gating in this process.

The edge trench 10 illustrated in FIG. 4 includes a field plate 14 at source potential, which is insulated from the surrounding semiconductor material of the semiconductor body 3 by a field plate insulation 15. The field oxide 16 on the edge zone 12 of a complementary conduction type is less thick in the process of body zone implantation than the field plate insulation 15 of the edge trench 10. As FIG. 2 illustrates, the edge trench 10 may divide the edge zone 12 of a complementary conduction type into two zones, these being the inner edge zone 35 between the cell region 4 and the edge trench 10 and an outer edge zone 34 from the edge trench 10 to a continuous annular channel stopper illustrated in FIG. 1, which in the present case is at drain potential, or to an annular layer not illustrated in the drawing, which masks the ion implantation. In this embodiment, the edge zone 12 of the complementary conduction type extends laterally from a channel stopper of a conductive material, which surrounds the semiconductor chip, via the edge trench 10 to the marginal body zones 49 of the cell field 4, virtually extending into the marginal body zones 49 of the cell field 4.

Figure 4A:
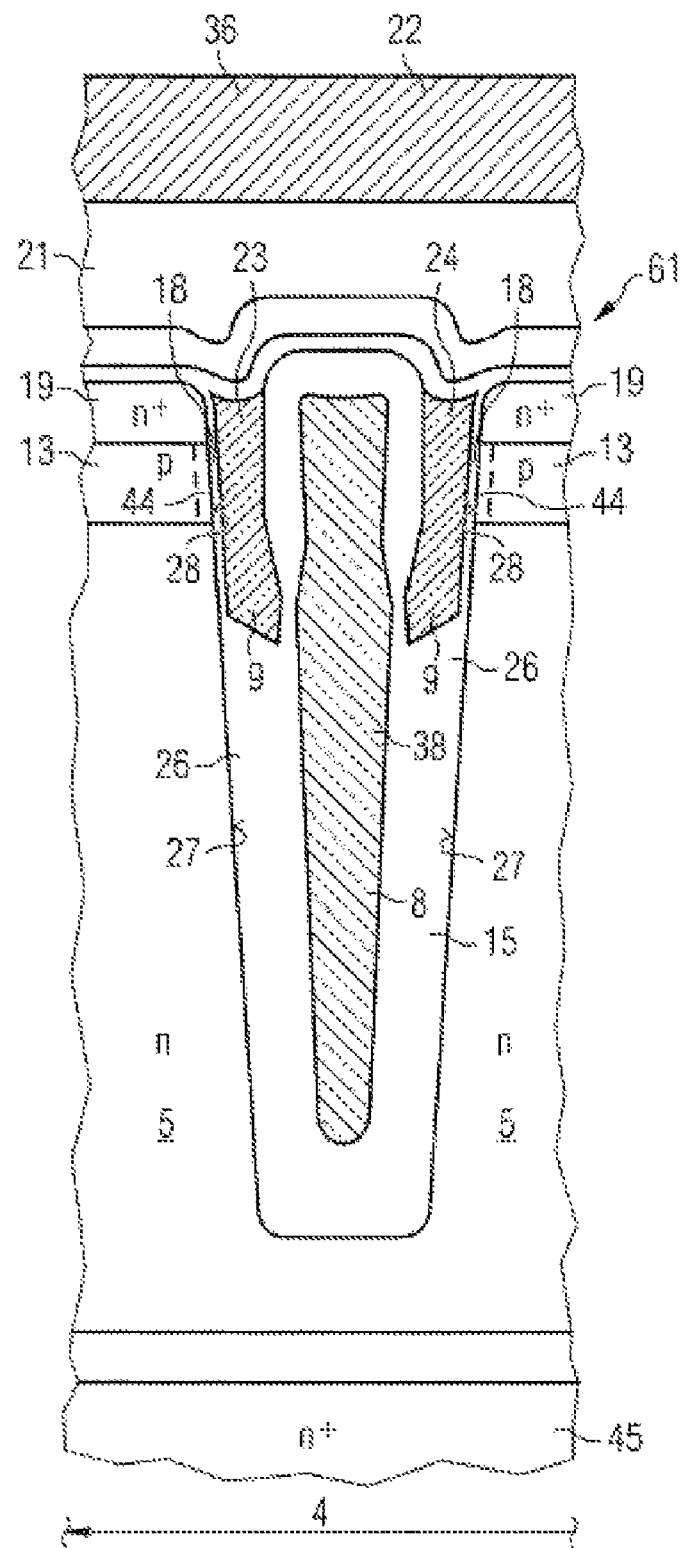
FIGS. 4a to 4c illustrate diagrammatic cross-sections through field plates in the cell field with different gate structures in the same trench of the field plates.
Figure 4B:
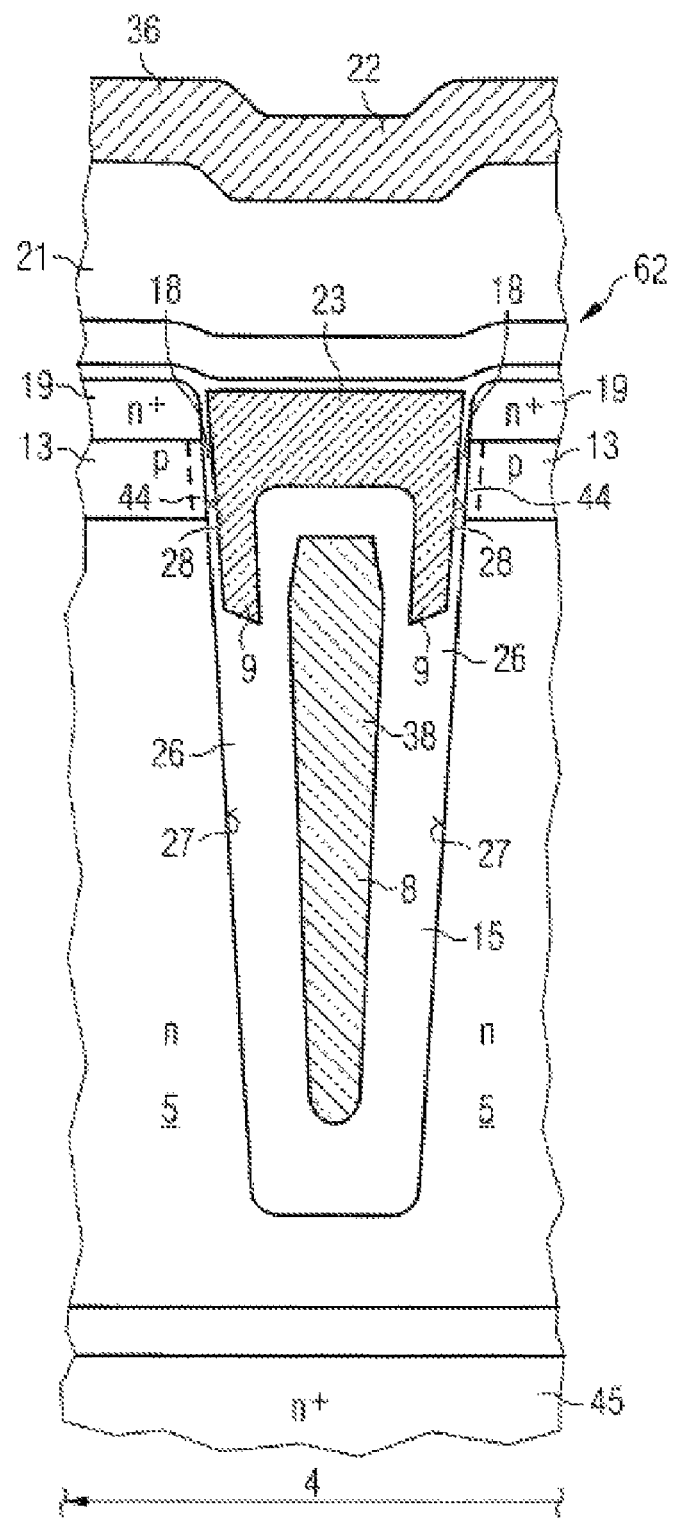
Figure 4C:
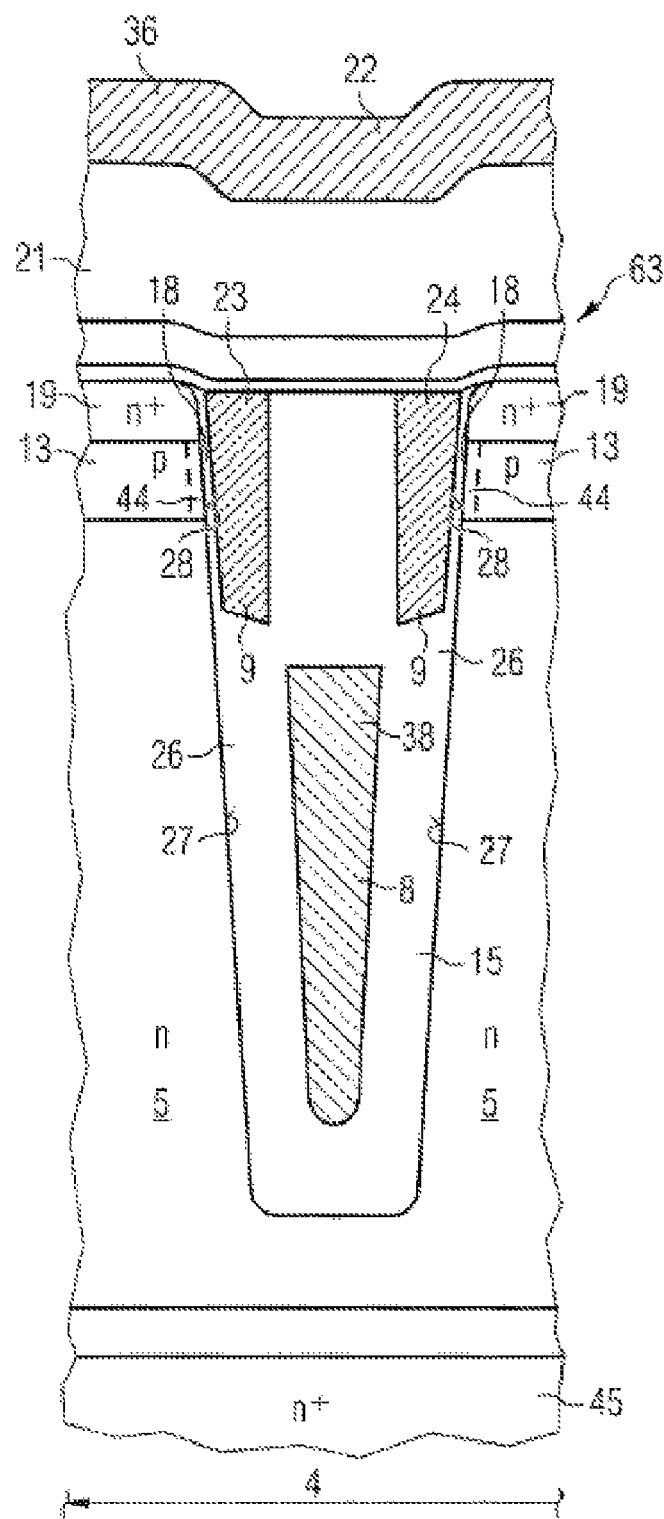

FIGS. 4a to 4c illustrate diagrammatic cross-sections through field plates 8 in the cell field 4 with different gate structures 61, 62 and 63 in the same trench.

FIG. 4a illustrates a diagrammatic cross-section through a field plate 8 in the cell field 4 with two gate electrodes 23 and 24 of a first gate structure 61, which can already be seen in FIG. 4. Components of the same function as those in FIG. 4 are identified by the same reference numbers and not explained again. If a suitable gate voltage is applied, the gate electrodes 23 and 24 cause the formation of two channels 44 in the body zones 13 between a highly doped n$^+$-type source zone 19 and less highly doped n$^-$-type drift zones.

FIG. 4b illustrates a diagrammatic cross-section through a field plate 8 in the cell field 4 with a joint gate electrode 23 of a second trench gate structure 62. If a suitable gate voltage is applied, the gate electrode 23 causes the formation of two channels 44 extending on either side of the second trench gate structure 61.

FIG. 4c illustrates a diagrammatic cross-section through a field plate 8 in the cell field 4 with two separate gate electrodes 23 and 24 of a third trench gate structure 63. In the region of the gate electrodes 23 and 24, however, there is no electrically conductive field plate material, but rather an insulating material. If a suitable voltage is applied to the gate electrodes 23 and 24, two conductive channels 44 are formed in the body zones 13 between a highly doped n$^+$-type source zone 19 and less highly doped n$^-$-type drift zones.

FIGS. 5 to 13 illustrate cross-sections along a line B-B of FIG. 1 through a section of a semiconductor body 3 in the process of the production of the device 1 according to FIG. 1.

Figure 5:
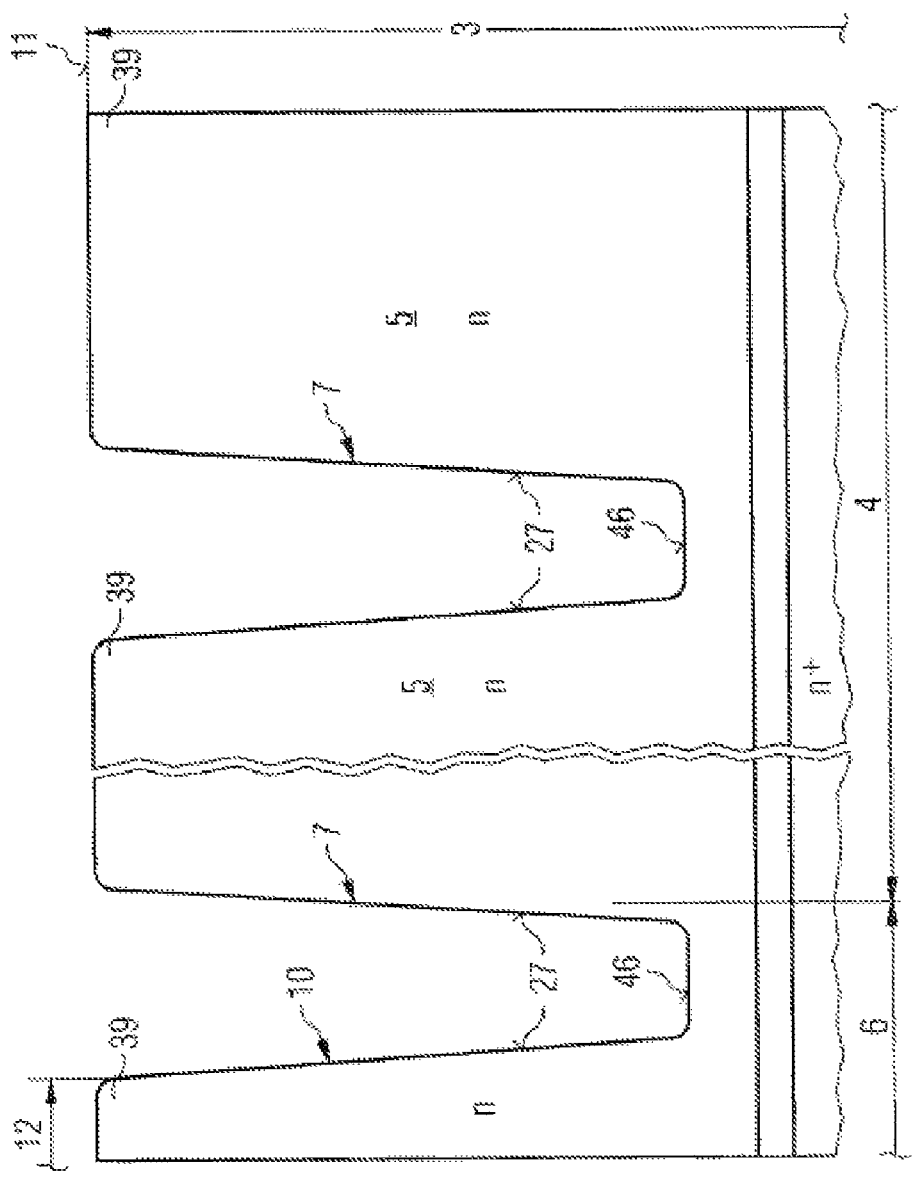
FIGS. 5 to 12 illustrate diagrammatic cross-sections through field plates in the cell field with different gate structures in the same trench of the field plates.
Figure 6:
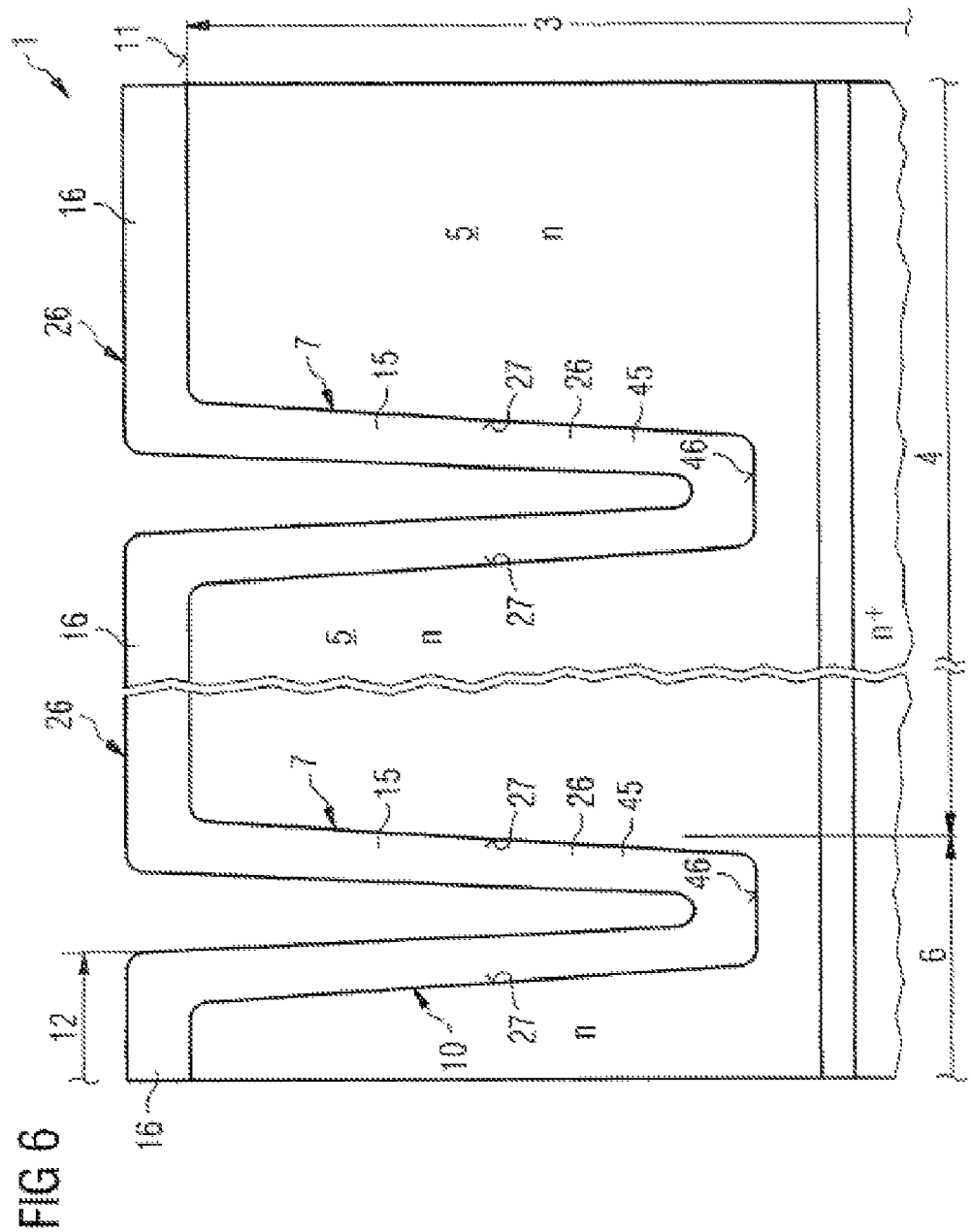

FIG. 5 illustrates a diagrammatic cross-section through a section of a semiconductor body 3 after the introduction of trench structures 7. These trench structures 7 are introduced into an n-type drift zone material in this embodiment; in this process trench walls 27 are formed and mesa structures 39 remain standing in the cell field 4 made of a semiconductor body material. The trench structures 7 and the mesa structures 39 are then coated with a silicon oxide layer by oxidation of the silicon, with the result that, as illustrated in FIG. 6, a silicon oxide acting as an insulating layer covers the front side 11 of the semiconductor body 3. As an alternative, an insulating material can be deposited from the gas phase. The insulating material may also be applied in several layers.

FIG. 6 illustrates a diagrammatic cross-section through the section from FIG. 5 after the application of an insulating layer 26. This insulating layer 26 forms a field oxide 16 on the top of the mesa structures and, on the trench walls 27, an insulating layer for field plates to be installed.

Figure 7:
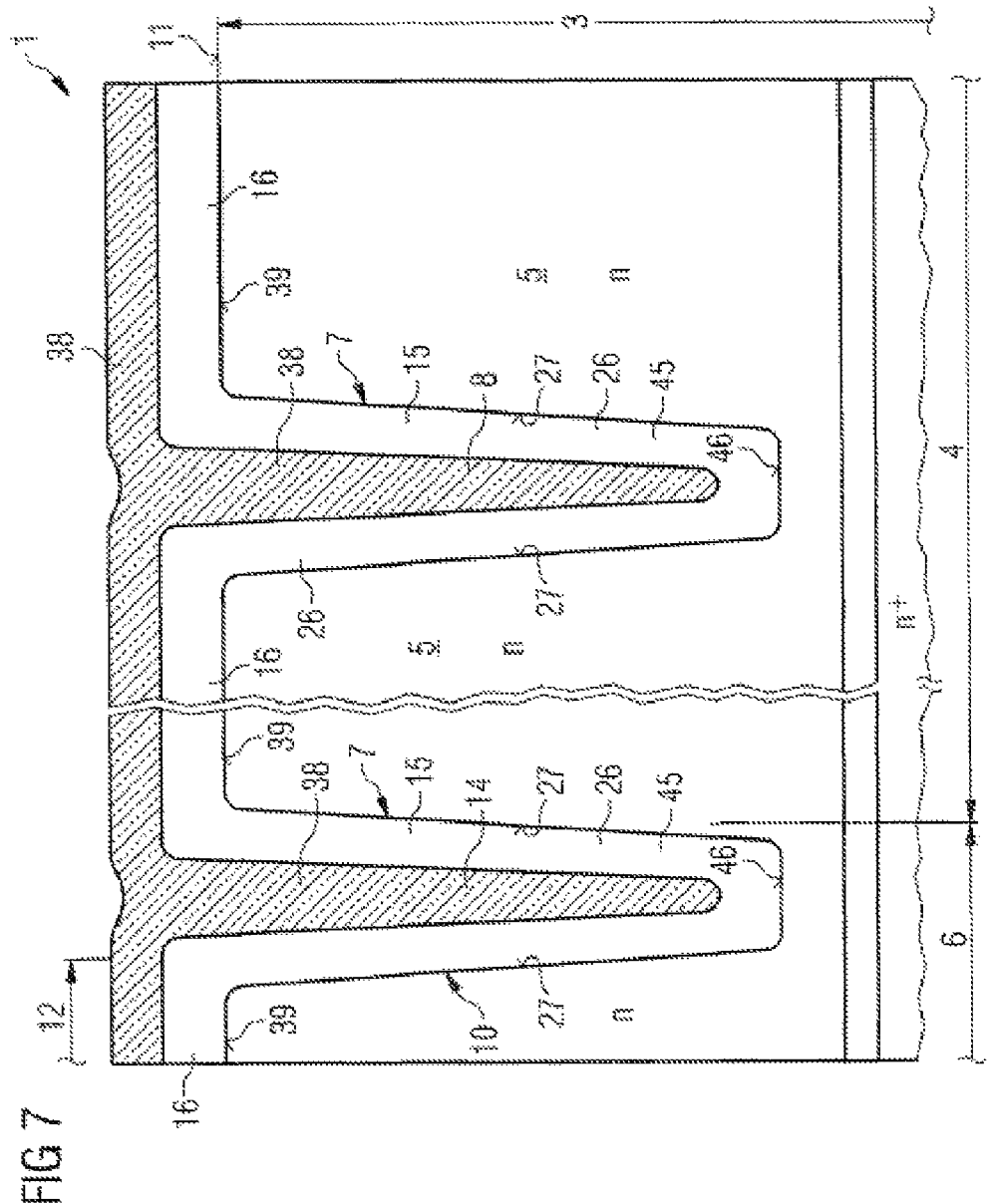

FIG. 7 illustrates a diagrammatic cross-section through the section from FIG. 6 after the trench structure 7 has been filled with a conductive polysilicon material 38. In place of the conductive polysilicon material 38, a conductive metallic material could be applied to the insulating layer 26 in the trench structure 7. In this process, the front side 11 of the semiconductor body 3 is simultaneously coated with a conductive polysilicon material or a conductive metallic material. As FIG. 8 illustrates, this is later removed from the front side 11 of the semiconductor body 3.

Figure 8:
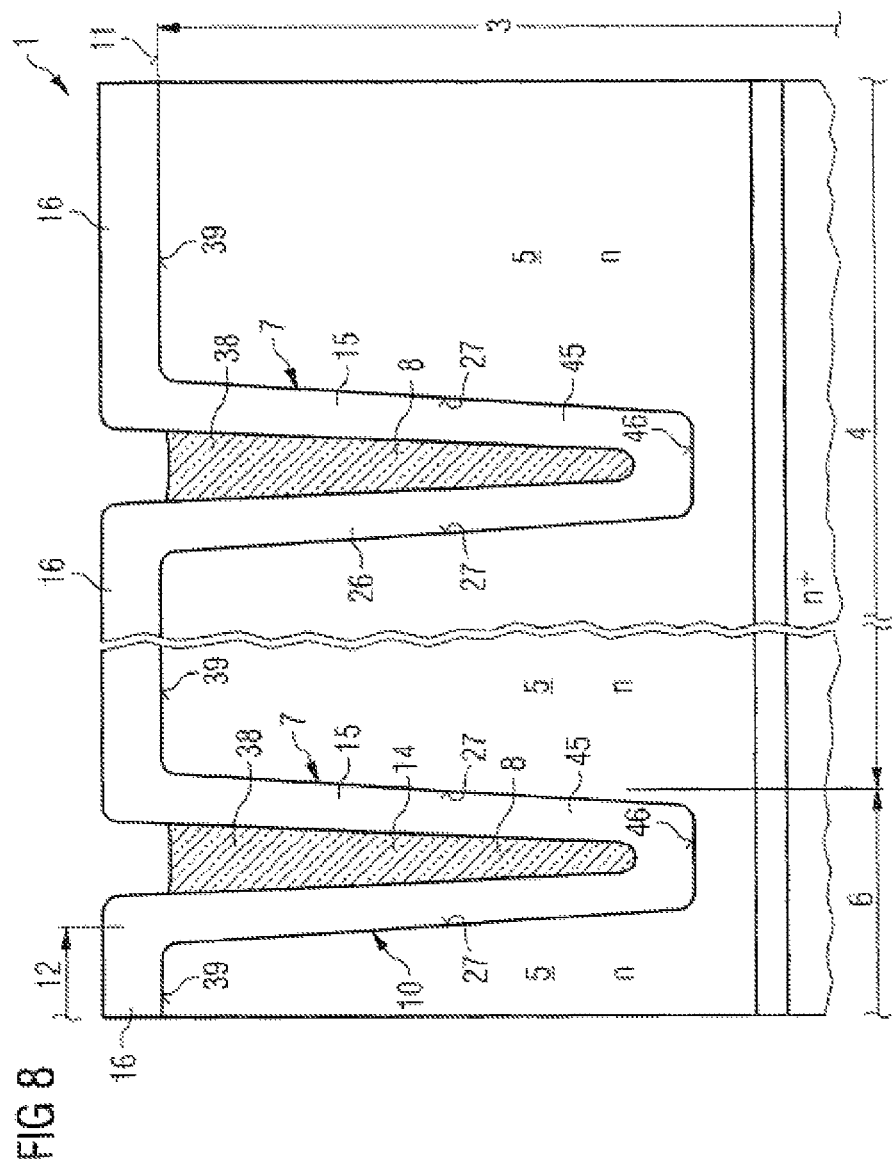

FIG. 8 illustrates a diagrammatic cross-section through the section from FIG. 7 after the removal of the polysilicon material or the conductive metallic material from a field oxide 16 on front sides 11 of mesa structures 39. Now both the cell field 4 and the edge trench 10 have field plates 8 insulated from the semiconductor body 3. While the field plates 8 in the cell field 4 are strip-shaped as illustrated in FIG. 1, the edge trench 10 with its field plate 14 surrounds the entire cell field 4.

Figure 9:
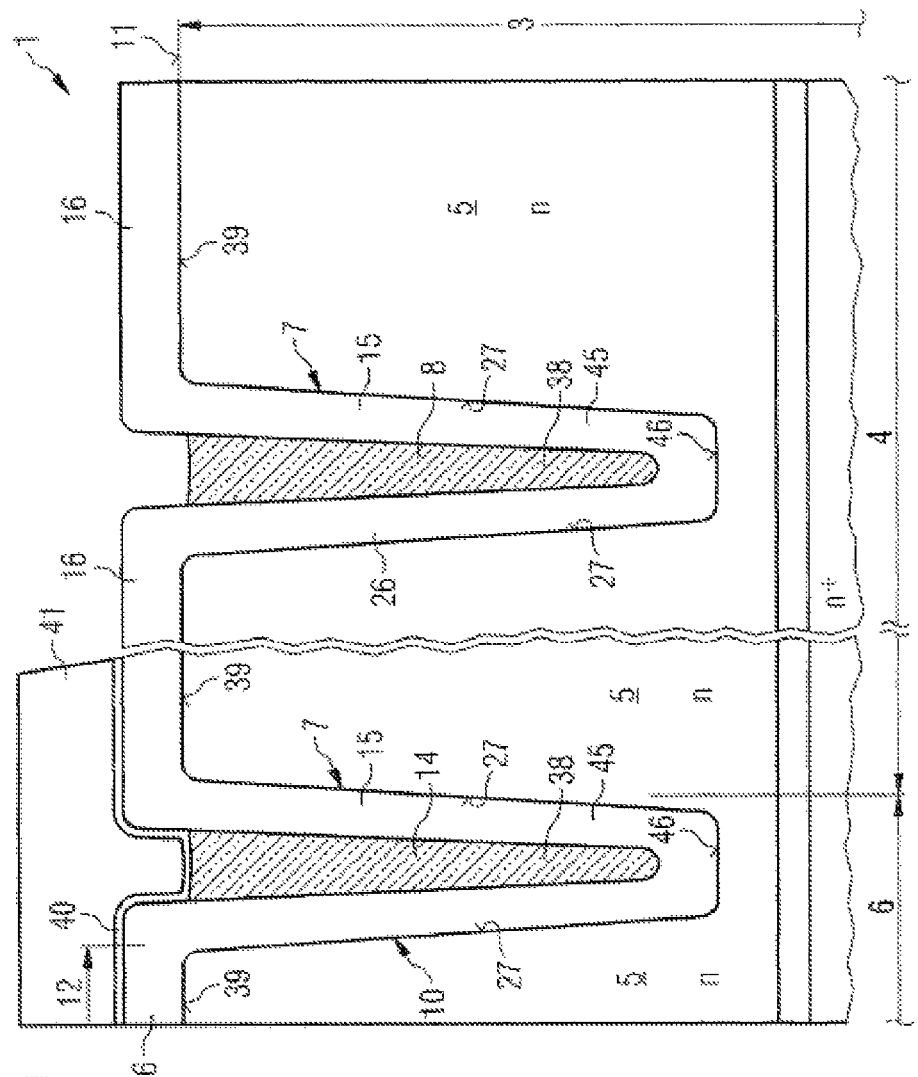

FIG. 9 illustrates a diagrammatic cross-section through the section from FIG. 8 after the application of a photoresist covering 41 to the field oxide 16 in the edge regions 34 and 35. The mesa structures 39 on the front side 11 of the semiconductor body 3 are, however, not yet exposed, because these regions are still covered by the field oxide 16.

Figure 10:
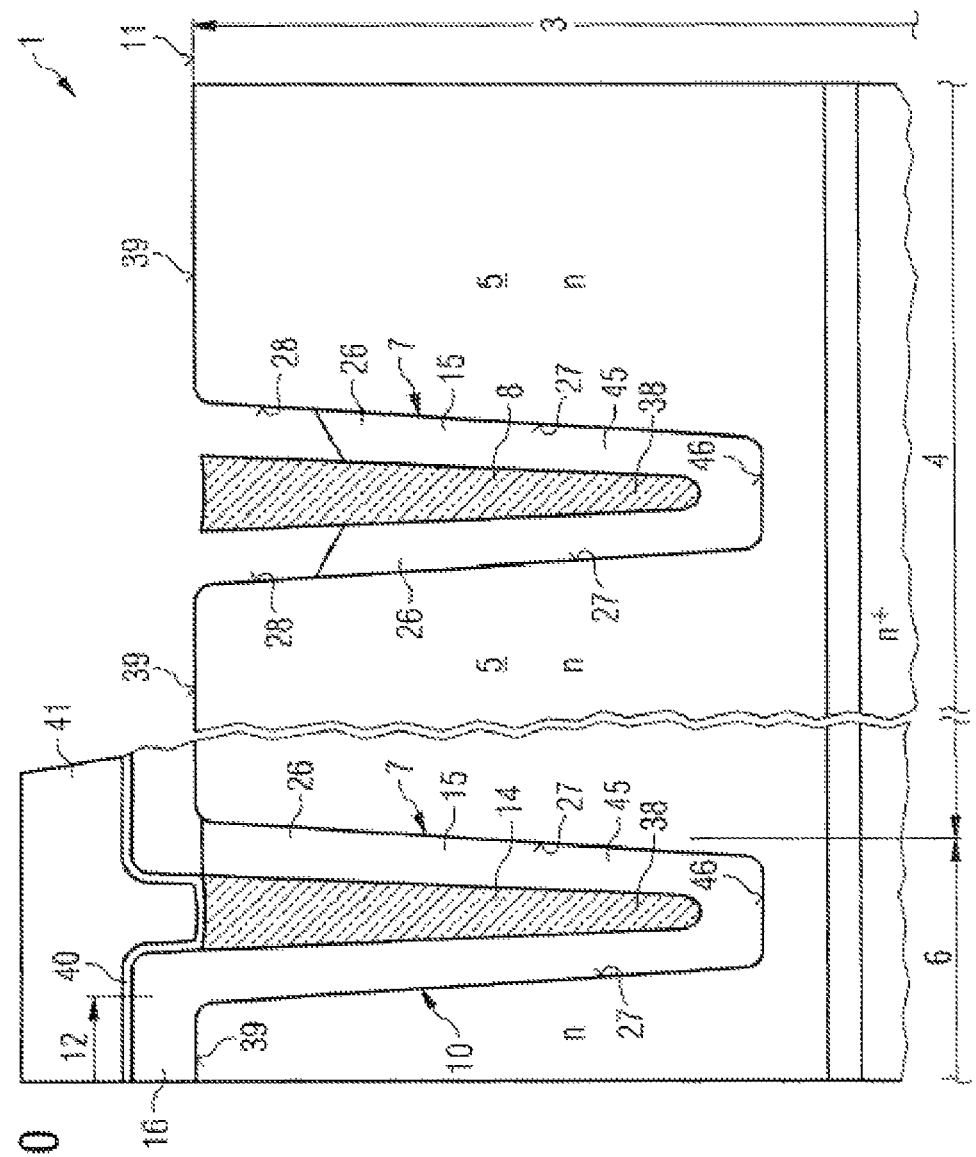

FIG. 10 illustrates a diagrammatic cross-section through the section from FIG. 9 after the removal of the field oxide 16 above the cell field 4 and the etching in the trench. This exposes an upper region 28 of the trench structure in the cell field 4, allowing the trench gate structures to be introduced here while the trench ends 45 remain surrounded by the field oxide.

Figure 11:
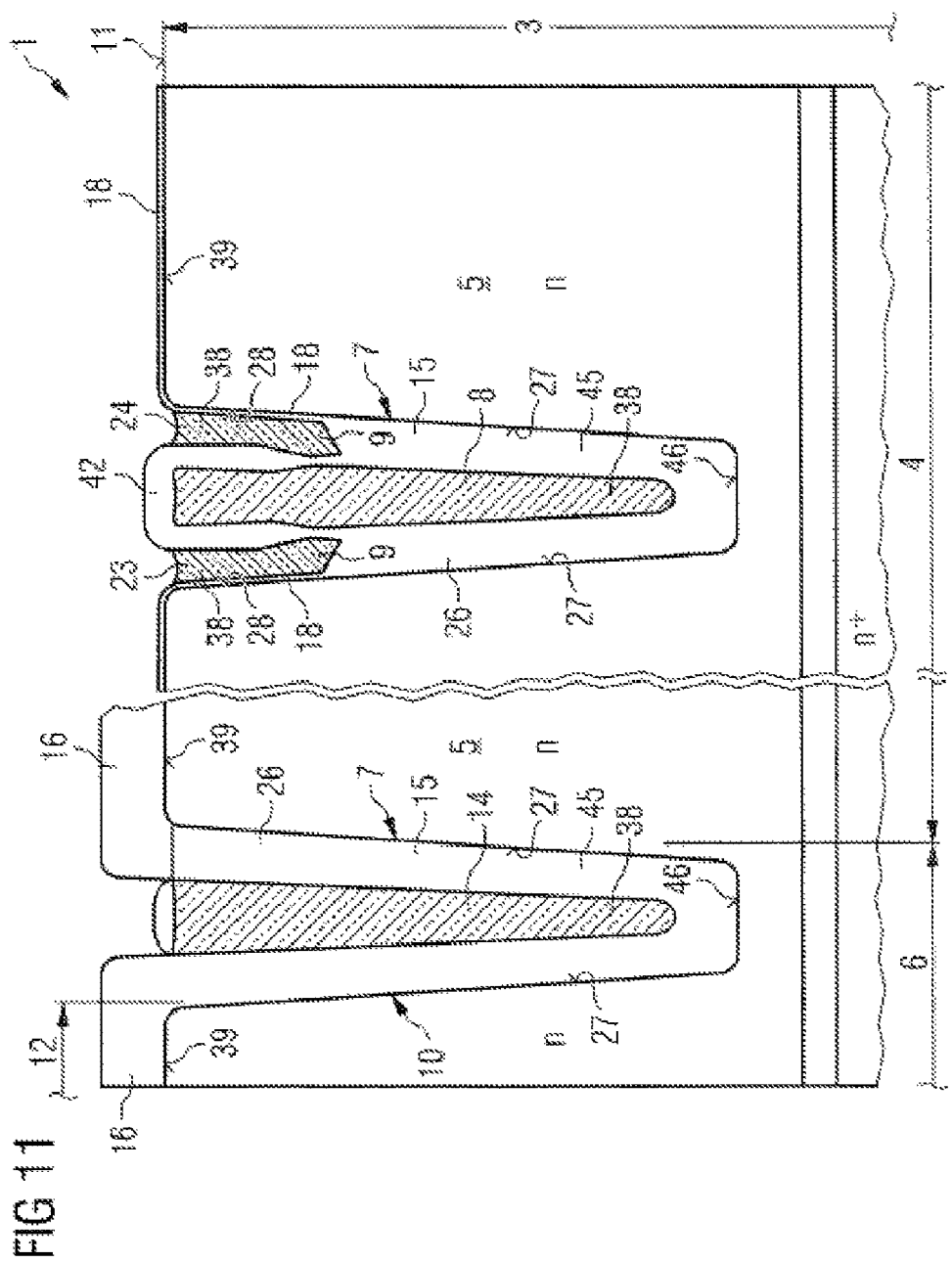

FIG. 11 illustrates a diagrammatic cross-section through the section from FIG. 10 after the removal of the photoresist covering on the edge zones 34 and 35, after the application of an insulating region 42 around the upper region of the field plate 8 and after the introduction of trench gate structures into the upper region 28 of the trench structures in the cell field 4. These upper regions 28 of the trench structures are now provided with a gate oxide 18 and gate electrodes 24 of a conductive material on the trench walls 27, an oxide layer 42 insulating the field plates 8 from the gate electrodes 9.

For this purpose, the upper region 28 of the trench structure 7 in the cell field 4 is filled with a conductive material, wherein for example the whole front side 11 of the semiconductor body 3 is covered with a polysilicon material or a conductive metallic material, which is subsequently removed from the front side, whereby mutually insulated trench gate structures 9 are created in the upper region 28 of the trench structure 7 in the cell field 4.

Figure 12:
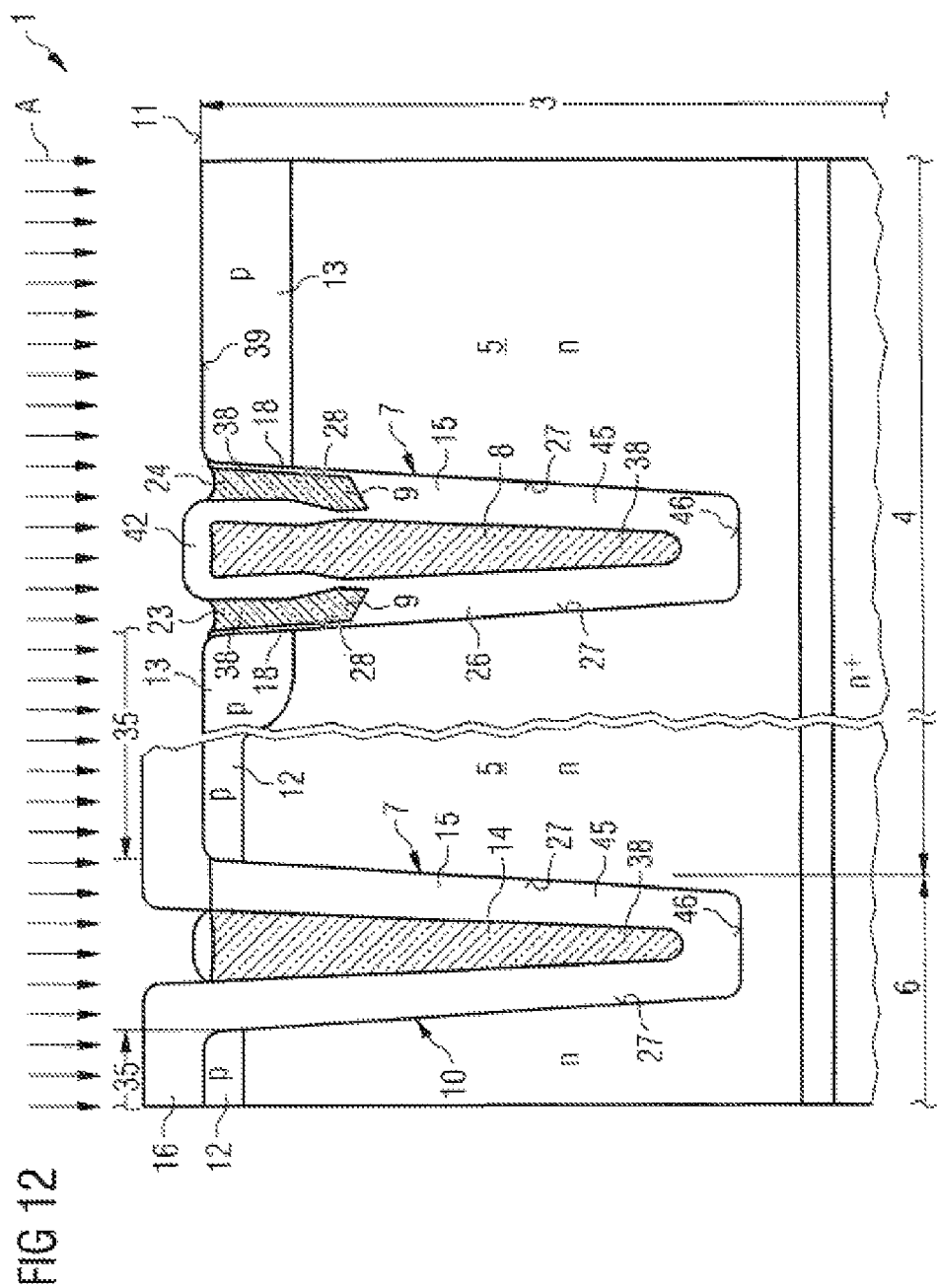

FIG. 12 illustrates a diagrammatic cross-section through the section from FIG. 11 after the removal of the gate oxide layer 18 on the front side 11 of the semiconductor body 3, followed by ion implantation. By ion implantation in the direction of the arrows A and a subsequent diffusion process, the body zones 13 illustrated in FIG. 12 are created, while the edge zones 34 and 35 of a conduction type complementing that of the drift zones 5 are created in the edge zone 12. As explained above, the edge zone 12 of the complementary conduction type can be introduced at a later point in time, but the oxide thickness values in the edge region 6 have already been almost doubled, with the result that a separate ion implantation for the edge zones 12 would involve a higher implantation energy but a lower dose than the implantation of the body zone region. In either case, the channel stopper region illustrated only in FIG. 1 is capable of interrupting the outer edge zone 34 in the edge region 6 up to the edge of the semiconductor chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   a semiconductor body having a first conduction type;
   a cell field including a drift zone of the first conduction type and body zones;
   an edge region surrounding the cell field;
   a trench structure including field plates with a trench gate structure in the cell field and an edge trench surrounding the cell field in the edge region; and an edge zone of a conduction type complementing the first conduction type and with doping material of the same conduction type as the body zones of the cell field, the edge zone of the complementary conduction type extending on either side of the edge trench such that the edge zone extends into both the cell field and the edge region so as to form a p-n junction between the edge zone and the edge region;

wherein the field plates of the trench structure in the cell field are at source potential and vertical trench gate structures surround each of the field plates and are insulated from the field plates with a gate oxide situated between the trench gate structures and the body zone.

2. The integrated circuit device of claim 1, wherein the edge zone of the complementary conduction type is doped less highly than the body zones of the cell field.

3. The integrated circuit device of claim 1, wherein the penetration depth of the edge zone of the complementary conduction type is less than the penetration depth of the body zones in the cell field relative to a front side of the edge zone.

4. The integrated circuit device of claim 1, wherein the edge trench comprises a field plate at source potential, which is isolated from the surrounding semiconductor material of the semiconductor body by a field plate insulation.

5. The integrated circuit device of claim 1, wherein the edge trench divides the edge zone of the complementary conduction type into two zones, these being an inner edge zone between the cell field and the edge trench and an outer edge zone between the edge trench and a continuous annular channel stopper at drain potential surrounding the edge zone.

6. The integrated circuit device of claim 4, wherein a field oxide is located on the edge zone of the complementary conduction type, which comprises a smaller thickness than the field plate insulation of the edge trench and is covered by a further thicker oxide layer.

7. The integrated circuit device of claim 1, further comprising a channel stopper of polysilicon which surrounds the edge zone.

8. The integrated circuit device of claim 1, wherein the doping material profile of the edge zone of the complementary conduction type gradually increases from a p-n junction with the semiconductor body of the first conduction type located below to the field oxide on the front side of the semiconductor body.

9. The integrated circuit device of claim 1, wherein the trench structure of the cell field is strip-shaped in its lateral dimension.

* * * * *